United States Patent
Cai et al.

(10) Patent No.: US 8,711,982 B1
(45) Date of Patent: Apr. 29, 2014

(54) AMPLITUDE-SHIFT-KEYING (ASK) ENVELOPE DETECTOR AND DEMODULATION CIRCUITS

(71) Applicant: Hong Kong Applied Science & Technology Research Institute Company Limited, Hong Kong (HK)

(72) Inventors: Guangjie Cai, Hong Kong (HK); Leung Ling (Alan) Pun, Hong Kong (HK); Tat Fu Chan, Hong Kong (HK)

(73) Assignee: Hong Kong Applied Science & Technology Research Institute Company, Ltd., Hong Kong ( * ) Notice: Subject to any disclaimer, the term of this patent is extended or adjusted under 35 U.S.C. 154(b) by 0 days.

(21) Appl. No.: 13/790,951

(22) Filed: Mar. 8, 2013

(51) Int. Cl.
*H03D 1/24* (2006.01)
*H03D 1/00* (2006.01)

(52) U.S. Cl.
USPC .......................................... 375/320; 329/362

(58) Field of Classification Search
CPC ......... H04B 1/40; H04H 20/30; H04H 20/49; G06F 2203/0384; H03D 1/2227; H03D 3/14; H03D 5/00; H04L 2025/03414; H03C 1/60
USPC .......... 375/259, 268, 269, 316, 320; 329/347, 329/358, 361, 362, 363; 327/50, 58, 61, 62
See application file for complete search history.

(56) References Cited

U.S. PATENT DOCUMENTS

| | | | |
|---|---|---|---|
| 3,241,079 A | 3/1966 | Snell | |
| 5,614,851 A | 3/1997 | Holzer et al. | |
| 5,724,002 A | 3/1998 | Hulick | |
| 7,269,395 B2 | 9/2007 | Choi et al. | |
| 7,737,731 B1 | 6/2010 | Luo et al. | |
| 7,907,005 B2 | 3/2011 | Kranabenter | |
| 2010/0189196 A1 | 7/2010 | Wang et al. | |
| 2012/0083205 A1 | 4/2012 | Marcu et al. | |
| 2013/0101064 A1* | 4/2013 | Sorrells et al. | 375/295 |
| 2013/0170583 A1* | 7/2013 | Ichiyama et al. | 375/300 |

\* cited by examiner

*Primary Examiner* — Tesfaldet Bocure
(74) *Attorney, Agent, or Firm* — Stuart T. Auvinen; gPatent LLC

(57) ABSTRACT

An envelope detector receives an input that is an Amplitude-Modulated (AM) or Amplitude-Shift-Keying (ASK) coded signal. Each channel has a sample switch and a diode that charge an internal sampling capacitor. A hold switch connects the internal sampling capacitor to a summing output capacitor or to a post-processing circuit. A reset switch discharges the internal sampling capacitor after each sample. Two or more channels may be time multiplexed to sample alternate cycles of the input, and then their outputs combined by the summing output capacitor or by the post-processing circuit. The diodes may be reversed to detect the negative envelope rather than the positive envelope. Clocks for the switches may be generated from the input, or may be from a separate clock source. Since the sampling window is open for a whole input cycle, the clock source is insensitive to phase error.

23 Claims, 15 Drawing Sheets

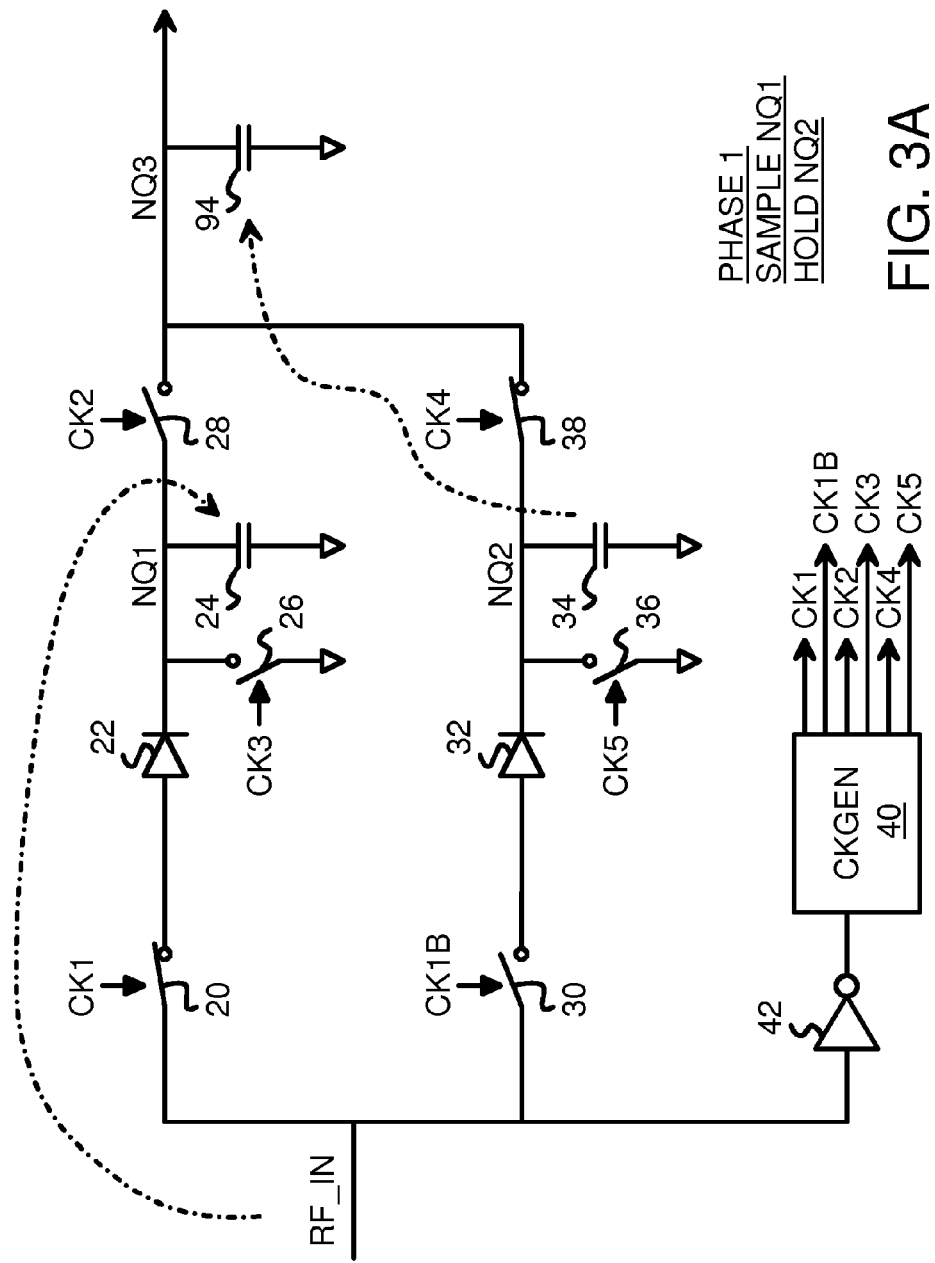

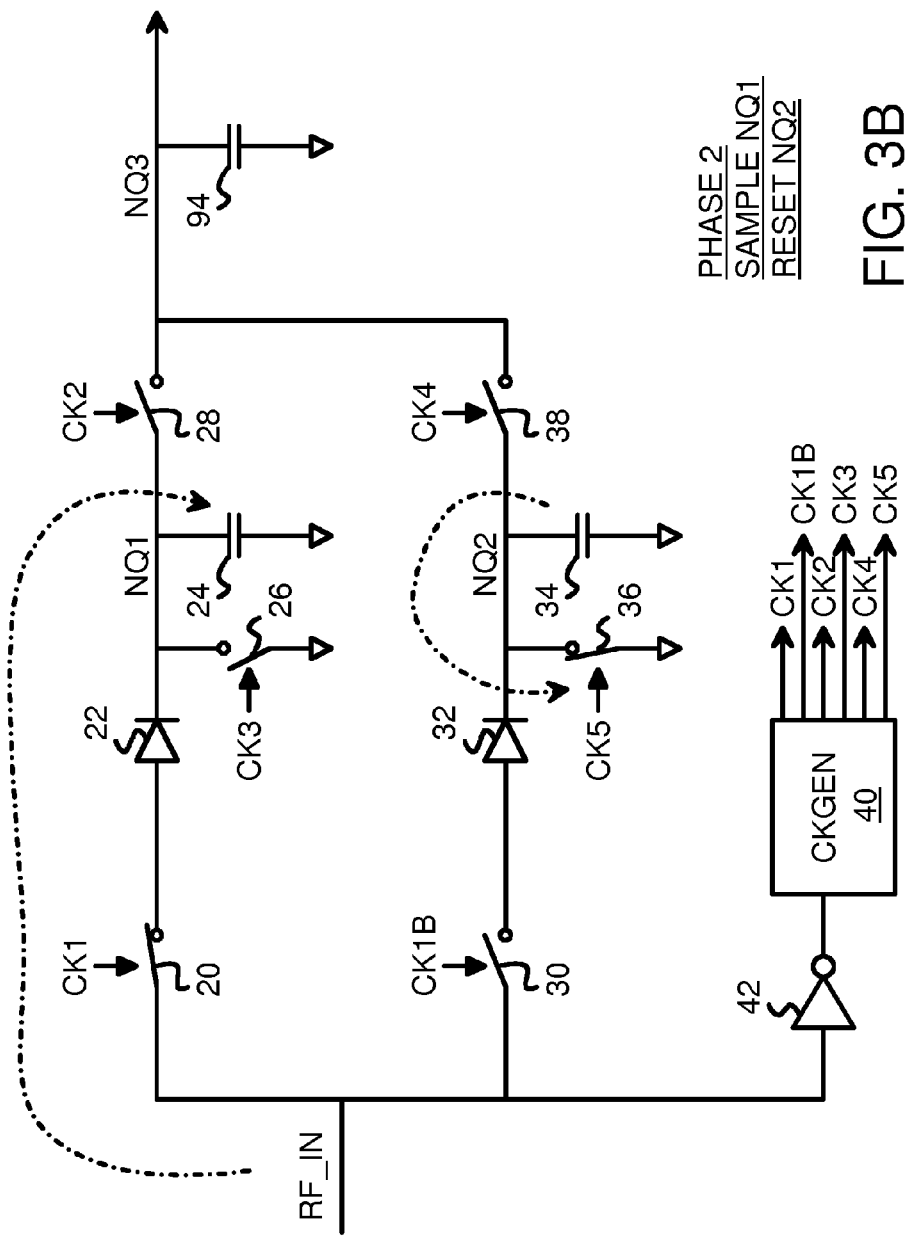

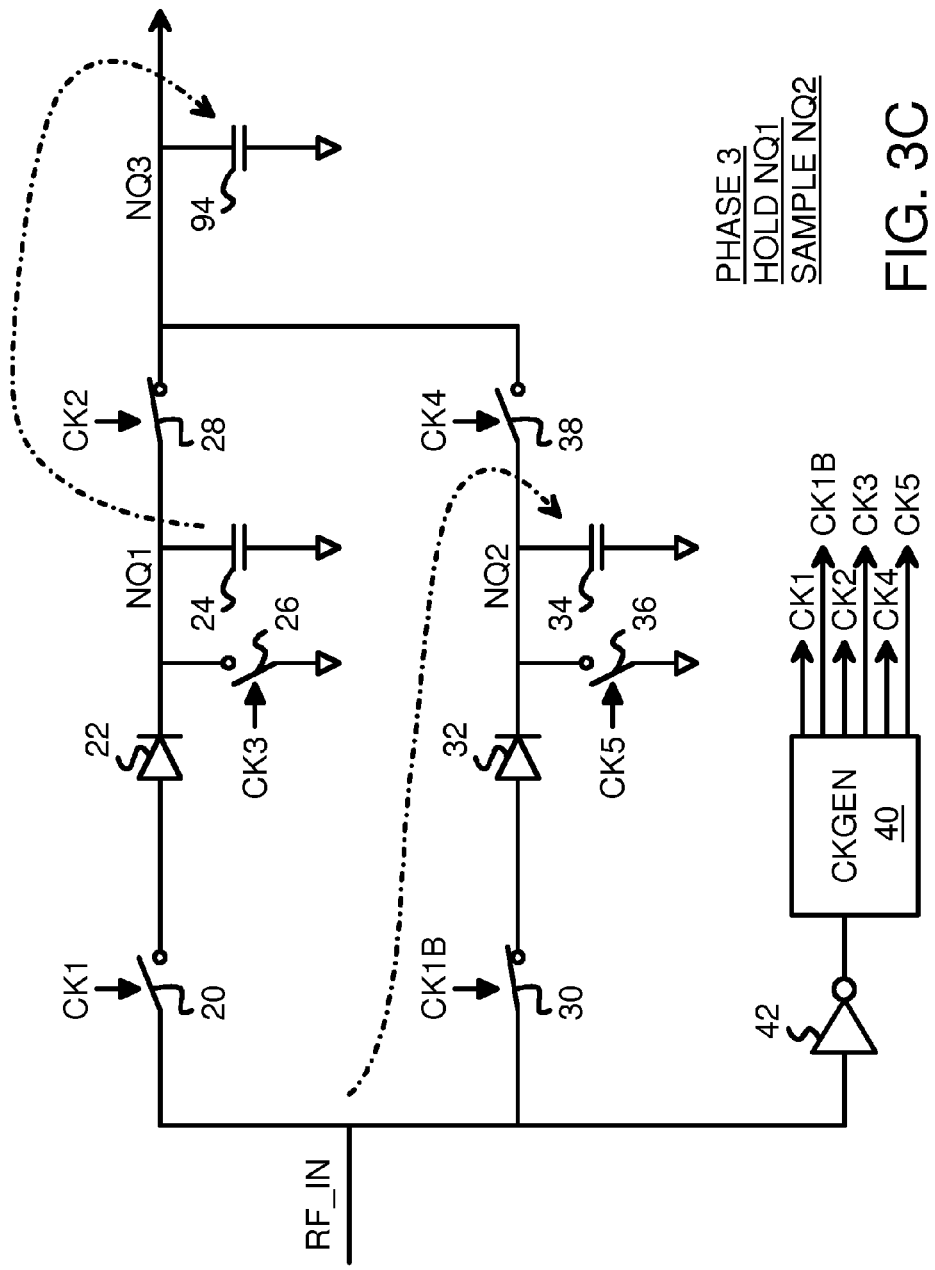

PHASE 4
RESET NQ1
SAMPLE NQ2

NEG. ENVELOPE DETEECT

HALF-RATE DETECTOR

US 8,711,982 B1

AMPLITUDE-SHIFT-KEYING (ASK) ENVELOPE DETECTOR AND DEMODULATION CIRCUITS

FIELD OF THE INVENTION

This invention relates to envelope detectors and demodulator circuits, and more particularly to an envelope detector circuit for an Amplitude-Modulation (AM) or Amplitude-Shift-Keying (ASK) signal.

BACKGROUND OF THE INVENTION

Many types of electronic systems include a receiver that must process a received signal. The signal may be applied to a carrier wave, such as by adjusting or modulating the amplitude of the carrier wave. Amplitude-Modulation (AM) and Amplitude-Shift-Keying (ASK) are two methods to modulate an amplitude to carry a signal.

A receiver may use an envelope detector to extract the signal from the carrier wave. The envelope detector outputs a signal that generally follows the peaks in the carrier wave over time. The envelope signal may then undergo further processing, such as by a demodulator or a digital-signal processor (DSP).

FIG. 1 is a graph of envelope detection. Carrier wave 102 has a generally constant frequency but its amplitude is modulated to carry a signal. The signal carried may contain or represent various information, such as a song, music, data, video, encrypted data, or some other kind of data stream.

An envelope detector ideally generates an upper envelope signal 104 from the positive peaks of carrier wave 102, and lower envelope signal 106 from the negative peaks or troughs of carrier wave 102. However, circuit losses in a real envelope detector may produce a voltage drop or loss, so that upper envelope real output 108 is lower in voltage than upper envelope signal 104. Similarly, lower envelope real output 110 has a smaller absolute voltage than lower envelope signal 106.

These circuit loses may be caused by voltage drops from a diode rectifier, a filter such as an R-C filter that imposes an R-C time constant limit, and various impedances that are sensitive to frequency. For example, a simple envelope detector having a diode rectifier followed by a filter has a maximum frequency that is limited by the filter's R-C time constant. Ripple on a power or ground line may disrupt the stability of some envelope detectors, such as those based on transistor inverters or drivers. Transistors having a grounded source or drain may inject power-line or ground ripple into the detected signal. Schmidt-trigger stages may not operate over a wide range of input voltages or signals with large swings. Active circuits such as opamps, equalizers, differentiators, and Phase-Locked Loops (PLL's) increase circuit complexity and may introduce secondary problems such as harmonics and loop stability.

Prior-art envelope detectors are often sensitive to frequency. As the frequency of carrier wave 102 or of the data being carried increases, the impedance losses and voltage drop can increase significantly. As frequency rises, the voltage drop can approach the total amplitude of carrier wave 102, creating an upper frequency limit to the envelope detector and the receiver. Thus very high data bit rates may not be allowed. Very complex circuits to tune the phases of recovered clocks may be needed, but these complex circuits may impose their own limits to operating frequency due to their complexity. Jitter and phase errors may increase and cause problems. Getting the clock phase to exactly match the peak in carrier wave 102 may be quite difficult.

What is desired is an envelope detector that can operate at very high frequencies and data rates. An envelope detector circuit that does not have many active components such as amplifier transistors with powered or grounded sources or drains is desirable to reduce ripple problems. An envelope detector with time-multiplexed or parallel paths is desirable to increase data rates.

BRIEF DESCRIPTION OF THE DRAWINGS

FIGS. 3A-D highlight operation of the dual-channel envelope detector.

DETAILED DESCRIPTION

The present invention relates to an improvement in envelope detectors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2:
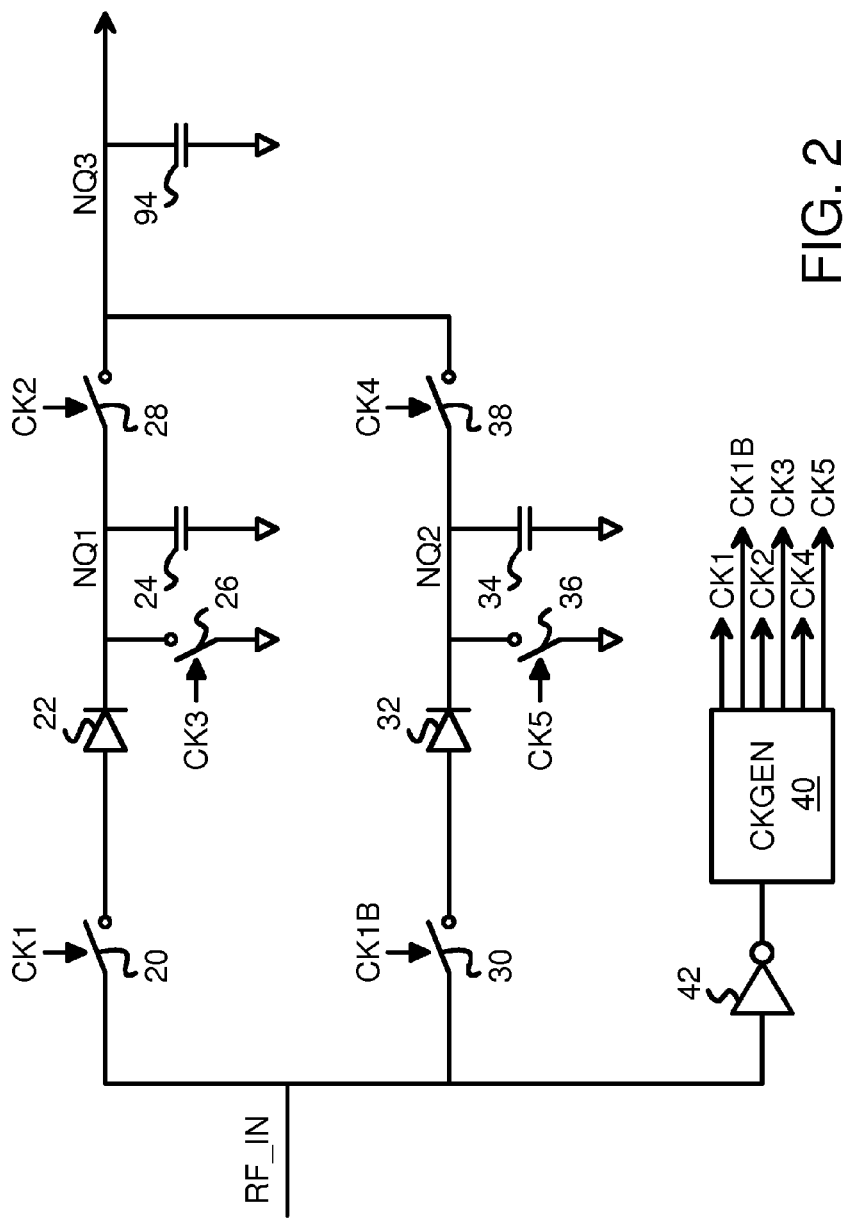
FIG. 2 is a diagram of a dual-channel sample and hold envelope detector.
Figure 4:
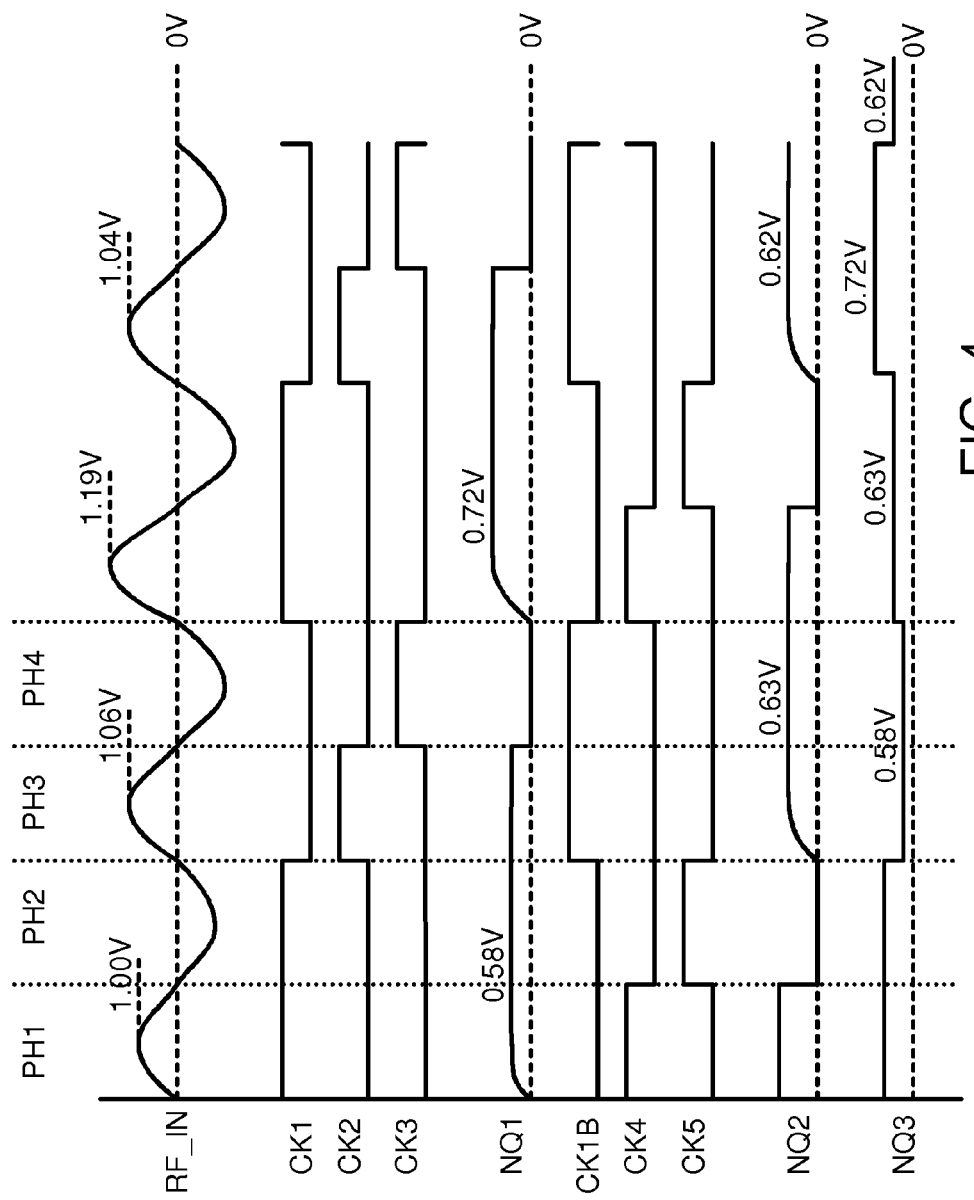
FIG. 4 is a timing diagram showing operation of the envelope detector of FIGS. 2-3.

FIG. 2 is a diagram of a dual-channel sample and hold envelope detector. A received signal RF_IN is applied to clock-recovery inverter 42 and clock generator 40 to generate clocks CK1, CK1B, CK2 . . . CK5. The timing of these generated clocks is shown in FIG. 4. RF_IN is an Amplitude-Modulated (AM) or Amplitude-Shift-Keying (ASK) coded signal.

A first detection channel samples RF_IN through sample switch 20, which is clocked by CK1. Diode 22 allows positive current to flow to charge sampling capacitor 24 during the positive peaks in carrier wave 102 on RF_IN. The sampled charge on charge sampling capacitor 24 passes through hold switch 28 when CK2 is active to charge summing output capacitor 94. When CK3 is active, reset switch 26 discharges sampling capacitor 24, causing node NQ1 to fall to ground.

A second detection channel samples RF_IN through sample switch 30, which is clocked by CK1B. Diode 32 allows positive current to flow to charge sampling capacitor 34 during the positive peaks in carrier wave 102 on RF_IN. The sampled charge on charge sampling capacitor 34 passes through hold switch 38 when CK4 is active to charge summing output capacitor 94 and node NQ3. When CK5 is active, reset switch 36 discharges sampling capacitor 34, causing node NQ2 to fall to ground.

Figure 3D:
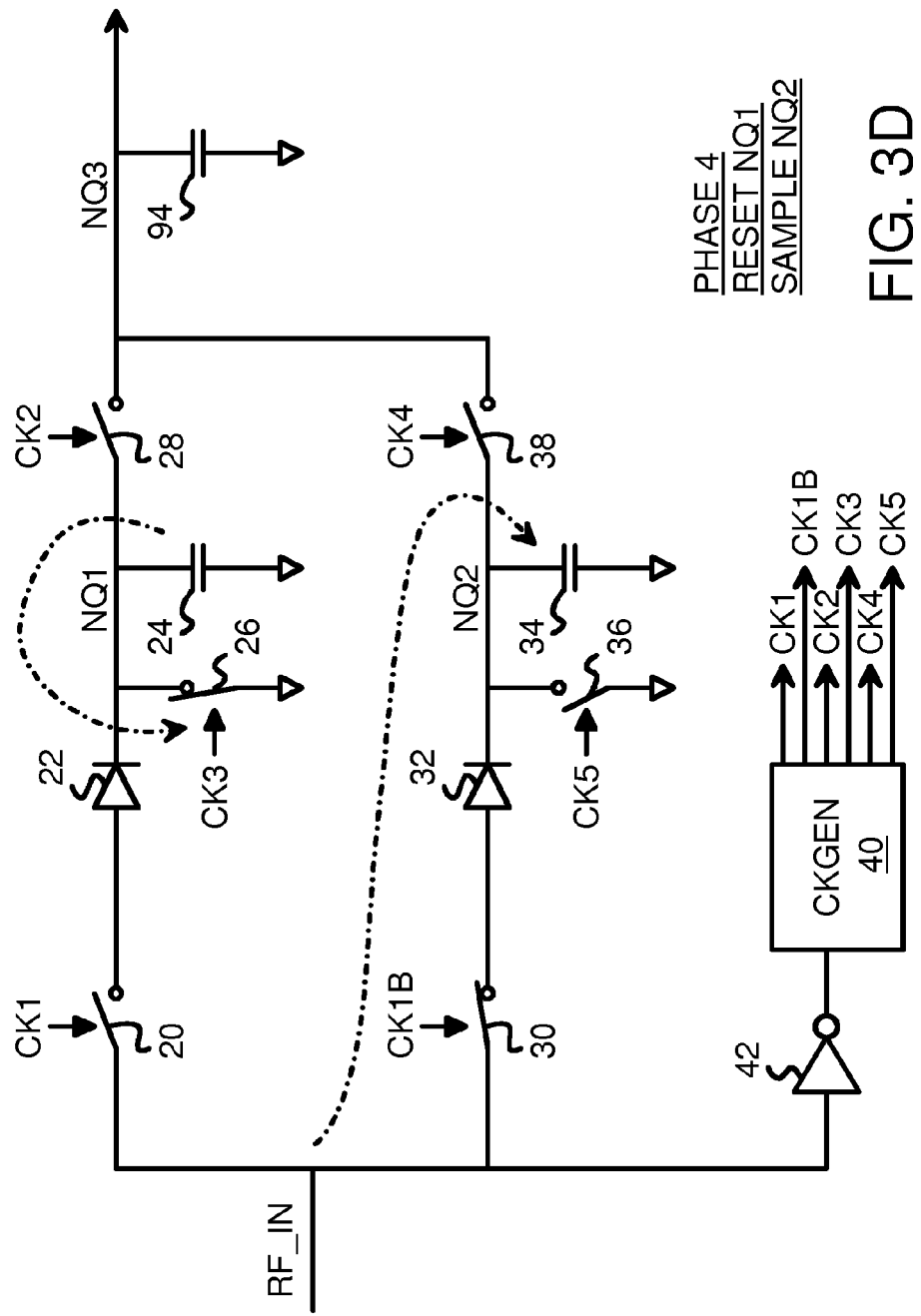

FIGS. 3A-D highlight operation of the dual-channel envelope detector. In FIG. 3A, during a first phase, node NQ1 samples input RF_IN, and node NQ2 holds to drive NQ3 and summing output capacitor 94. Clock CK1 and CK4 are high and CK1B is low. Sample switch 20 in the first channel is closed and conducts, and hold switch 38 is closed and conducting in the second channel. All other switches are open and not conducting.

The AM or ASK modulated signal on RF_IN is blocked from the second channel by sample switch 30 being open, but passes through sample switch 20 to charge sampling capacitor 24 and node NQ1 in the first channel. Reset switch 26 and hold switch 28 are open in the first channel.

The prior-sampled signal on sampling capacitor 34 and node NQ2 in the second channel charges or discharges summing output capacitor 94 through hold switch 38. Thus the output voltage on output node NQ3 is adjusted somewhat.

In FIG. 3B, during a second phase, node NQ1 is still sampling the input RF_IN, but node NQ2 is reset. Clock CK1 and CK5 are high and CK1B is low. Sample switch 20 in the first channel is closed and conducts, while reset switch 36 is closed and conducting in the second channel. All other switches are open and not conducting.

In the second channel, sampling capacitor 34 is discharged by reset switch 36 being on. This resetting prepares the second channel to sample the RF_IN input in the future third and fourth phases. Node NQ3 and summing output capacitor 94 are isolated by hold switches 28, 38 being open. During the second phase, summing output capacitor 94 holds the output voltage for use by downstream logic, such as a DSP or demodulator.

In FIG. 3C, during a third phase, node NQ1 holds to drive NQ3 and summing output capacitor 94, and node NQ2 samples input RF_IN. Clock CK1B and CK2 are high and CK1 is low. Sample switch 30 in the second channel is closed and conducts, and hold switch 28 is closed and conducting in the first channel. All other switches are open and not conducting.

The AM or ASK modulated signal on RF_IN is blocked from the first channel by sample switch 20 being open, but passes through sample switch 30 to charge sampling capacitor 34 and node NQ2 in the second channel. Reset switch 36 and hold switch 38 are open in the second channel.

The prior-sampled signal on sampling capacitor 24 and node NQ1 in the first channel charges or discharges summing output capacitor 94 through hold switch 28. Thus the output voltage on output node NQ3 is adjusted somewhat, this time by the first channel.

In FIG. 3D, during a fourth phase, node NQ2 is still sampling the input RF_IN, but node NQ1 is reset. Clock CK1B and CK3 are high and CK1 is low. Sample switch 30 in the second channel is closed and conducts, while reset switch 26 is closed and conducting in the first channel. All other switches are open and not conducting.

In the first channel, sampling capacitor 24 is discharged by reset switch 26 being on. This resetting prepares the first channel to sample the RF_IN input in a later first and second phase. Node NQ3 and summing output capacitor 94 are isolated by hold switches 28, 38 being open. During the fourth phase, summing output capacitor 94 holds the output voltage for use by downstream logic, such as a DSP or demodulator.

FIG. 4 is a timing diagram showing operation of the envelope detector of FIGS. 2-3. The amplitude of input signal RF_IN is modulated, such as by a transmitter, and the peaks of RF_IN have differing voltages. The first peak has a voltage of 1.00 volt, the second peak has a voltage of 1.06 volt, the third peak is 1.19 volt, and the fourth peak falls back to 1.04 volt.

The four phases highlighted in FIGS. 3A-D occur over two cycles of RF_IN. Thus CK1 is high and CK1B is low for the first and second phases, during the first cycle of RF_IN, while CK1 is low and CK1B is high for the third and fourth phases, during the second full cycle of RF_IN. CK2 pulses high to drive summing output capacitor 94 through hold switch 28 during the third phase, while CK3 pulses high to turn on reset switch 26 and reset NQ1 during the fourth phase.

The first channel samples RF_IN during the first cycle of RF_IN, when the sampled voltage is 1.00 volt, and during the third full cycle of RF_IN, when the sampled voltage is 1.19 volt. During the first cycle of RF_IN, the internal node NQ1 in the first channel reaches 0.58 volt rather than the full 1.00 volt of RF_IN due to losses in the channel, such as through diode 22 and by charge sharing with sampling capacitor 24 and with parasitic capacitances in the first channel.

During the third full cycle of RF_IN, internal node NQ1 rises to 0.72 volt when RF_IN is 1.19 volt. CK3 resets NQ1 to ground through reset switch 26 during the fourth phase. During the third phase, CK2 is high and hold switch 28 connects NQ1 to output NQ3. The voltage on output NQ3 rises or falls as charge is shared between sampling capacitor 24 and summing output capacitor 94. In this ideal example, NQ3 matches NQ1, but in a real circuit some voltage losses could occur. Thus NQ3 changes to 0.58 volt during the third phase.

The second channel samples RF_IN during the second cycle of RF_IN, when the sampled voltage is 1.06 volt, and during the fourth full cycle of RF_IN, when the sampled voltage is 1.04 volt. During the second cycle of RF_IN, the internal node NQ2 in the second channel reaches 0.63 volt rather than the full 1.06 volt of RF_IN due to losses in the channel, such as through diode 32 and by charge sharing with sampling capacitor 34 and with parasitic capacitances in the second channel.

During the fourth full cycle of RF_IN, internal node NQ2 rises to 0.62 volt when RF_IN is 1.04 volt. CK5 resets NQ2 to ground through reset switch 36 during the second phases. During the first phases, CK4 is high and hold switch 38 connects NQ2 to output NQ3. The voltage on output NQ3 rises or falls as charge is shared between sampling capacitor 34 in the second channel and summing output capacitor 94. In this ideal example, NQ3 matches NQ2, but in a real circuit some voltage losses could occur. Thus NQ3 changes to 0.63 volt during the first phase of the third cycle of RF_IN.

The output NQ3 is alternately driven by the first channel and the second channel in alternate cycles of the input RF_IN. Each channel can operate at half of the overall speed and data rate of RF_IN. Thus the data rate supported may be doubled by operating the two channels in parallel.

Figure 5:
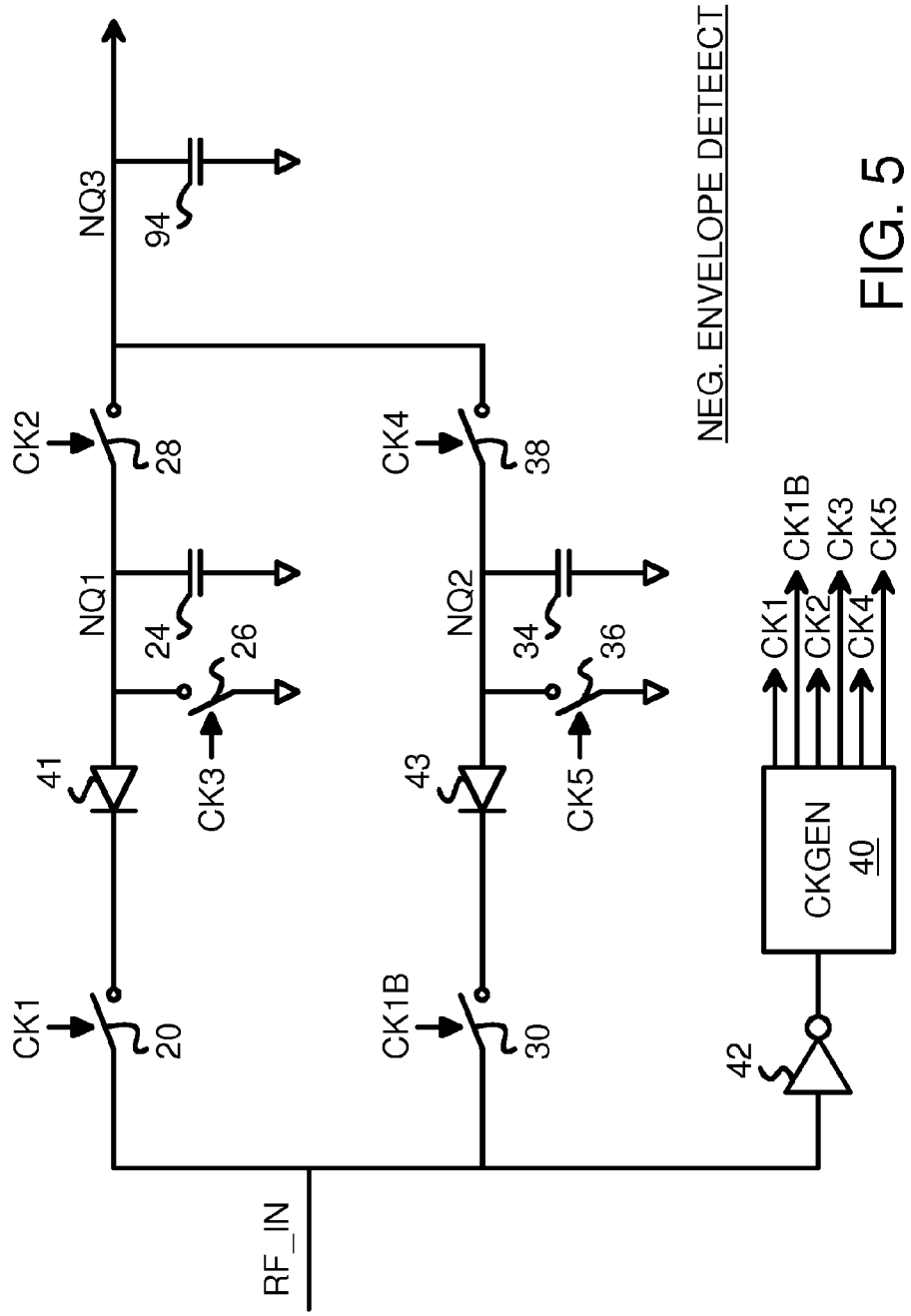
FIG. 5 shows an envelope detector for detecting negative peaks.

FIG. 5 shows an envelope detector for detecting negative peaks. Diodes 41, 43 are reversed in direction or polarity from diodes 22, 32 of FIGS. 2-3. Otherwise, operation is as described earlier. Rather than sample the peak positive voltages of RF_IN, the most-negative voltages of the troughs of RF_IN are sampled. Sampling capacitor 24 is discharged and NQ1 falls to a voltage below ground as positive current flows from sampling capacitor 24 to RF_IN through diode 41 and sample switch 20. Reset switch 26 charges sampling capacitor 24 from a negative voltage back up to ground.

Figure 1:
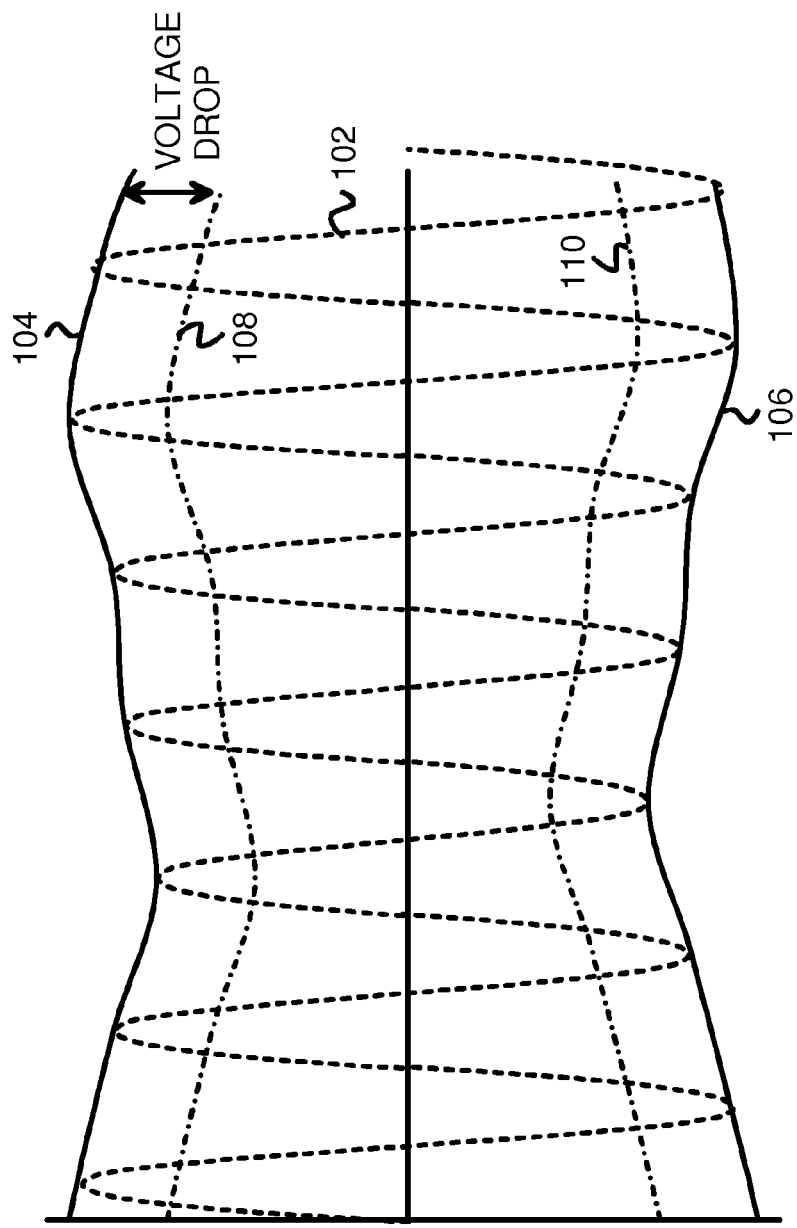
FIG. 1 is a graph of envelope detection.

Both a positive envelope detector, such as shown in FIGS. 2-3, and a negative envelope detector such as shown in FIG. 5, may sample the same RF_IN input, providing a system with both the upper envelope signal 104 and the lower envelope signal 106 (FIG. 1).

Figure 6:
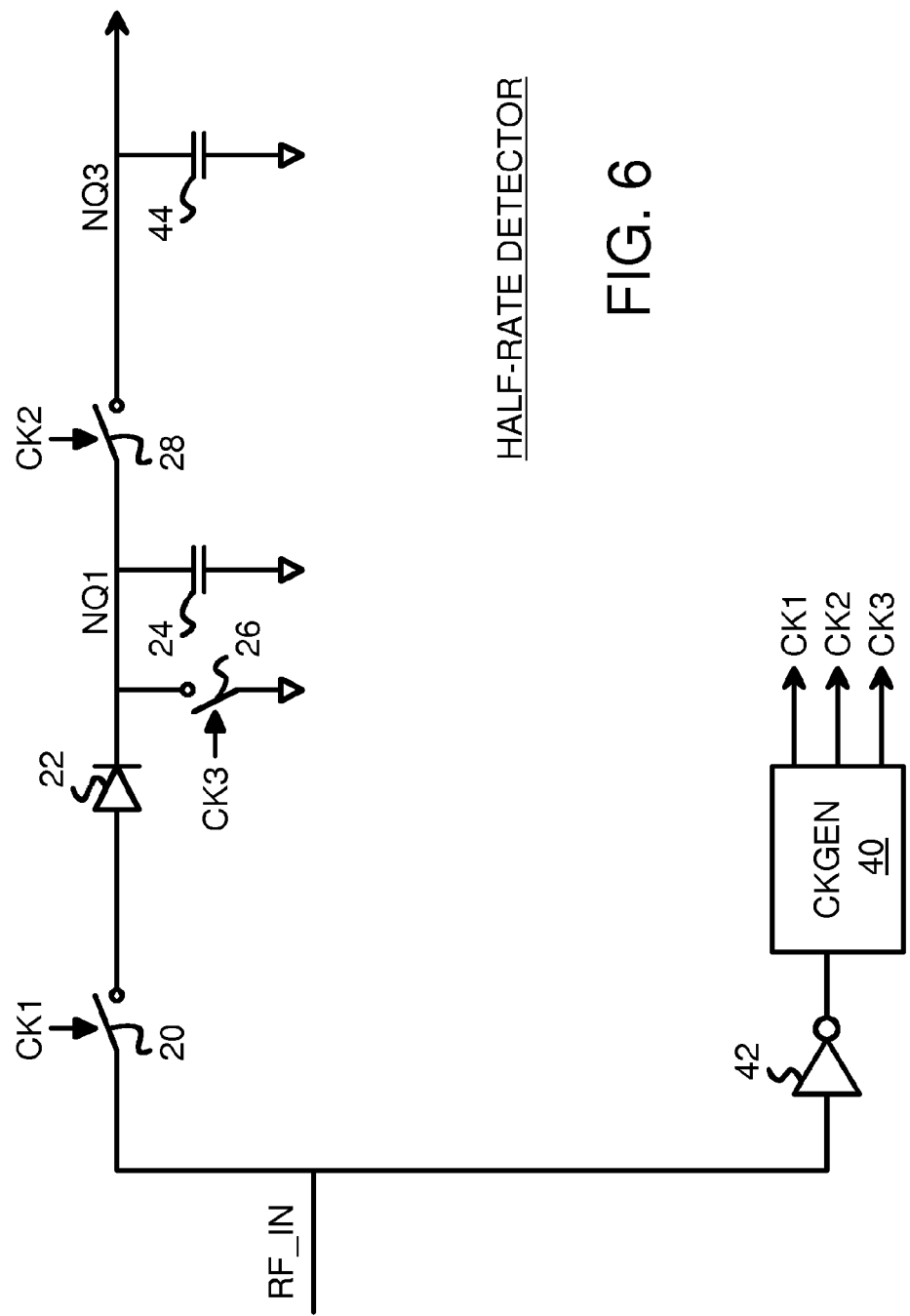
FIG. 6 is a single-channel envelope detector.

FIG. 6 is a single-channel envelope detector. Clock generator 40 generates only CK1, CK2, and CK3. There is no second channel of sample and hold. Instead, sample switch 20 closes once every two cycles of RF_IN to sample the input, which charges sampling capacitor 24, holding the charge on node NQ1. Then hold switch 28 closes to share charge with summing output capacitor 94, generating the output voltage on node NQ3.

Since there is only one channel, the maximum sampling rate is half of that for FIGS. 2-5. The maximum data rate is half of the carrier frequency.

Figure 7:
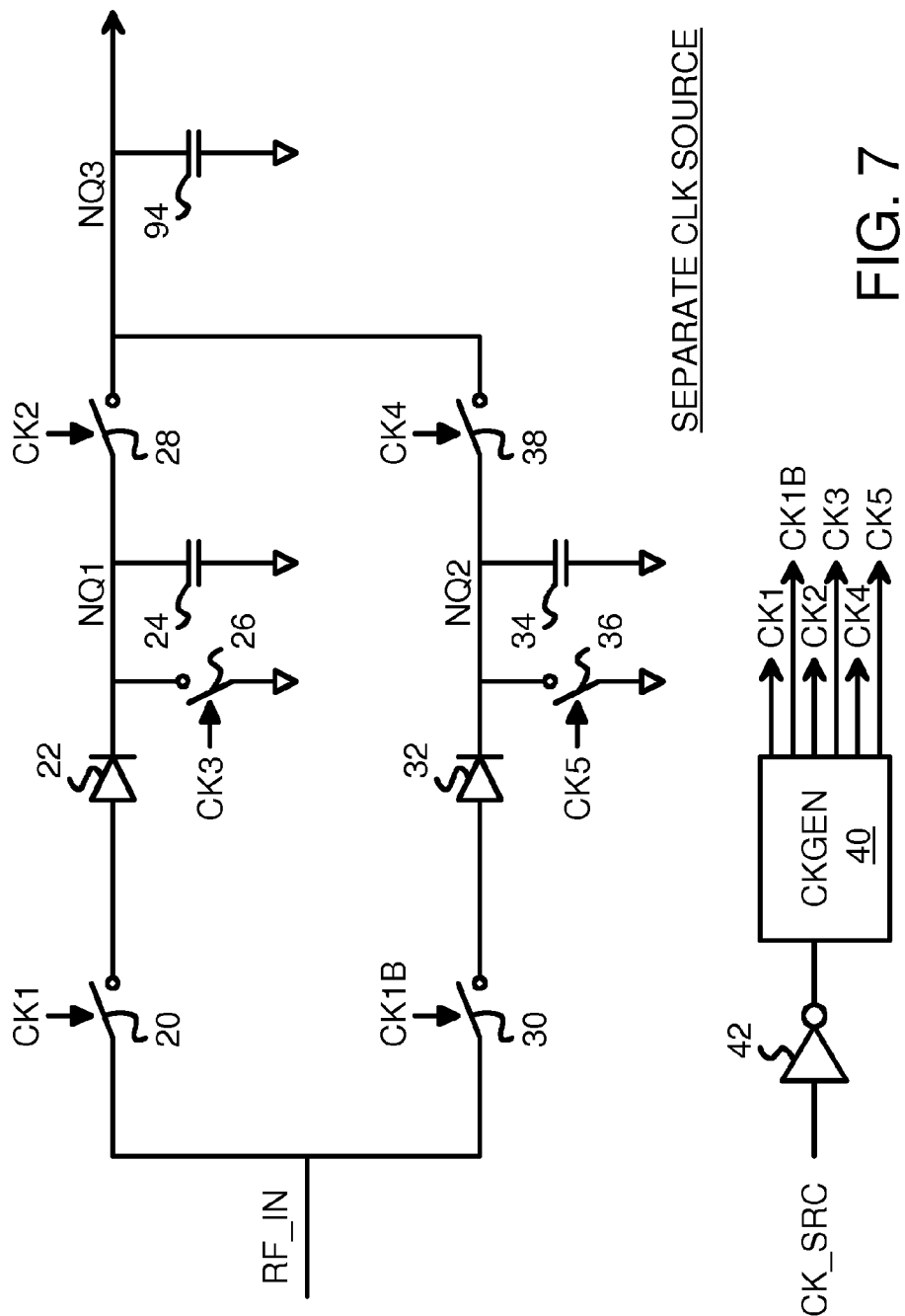
FIG. 7 shows an envelope detector with a separate clock source.

FIG. 7 shows an envelope detector with a separate clock source. Rather than recover the clock from the input signal RF_IN, in this embodiment a separate clock source CK_SRC is available. This independent clock source CK_SRC is input to clock-recovery inverter 42 to generate the clocks from clock generator 40.

When the input signal RF_IN is ASK coded or Amplitude-Modulated (AM), the frequency and phase of carrier wave 102 is relatively constant. Only the amplitude is modulated. Thus the clock tends to be very stable. An independent clock source may be generated with the same frequency as the carrier wave of the transmitter that generates RF_IN. The phase of the clock source may be matched or locked to the phase of RF_IN using a Phase-Locked Loop (PLL) or by other methods, but this is not necessary. When the maximum data rate is used, a PLL may be added so that the rising clock edge occurs when RF_IN is below ground or the midpoint voltage. Multiple clock phases may be generated, and a clock phase that samples RF_IN below ground is selected for use. Since the peaks of RF_IN are sampled over one full cycle, the exact timing of the clocks is less sensitive to the exact phase, or phase errors between input RF_IN and the clock source. The peak voltage is captured even when some phase error exists. Since the internal sampling capacitors are reset after each sample by reset switches, there is little or no carry over to future cycles should a sampling error occur for one cycle.

Figure 8:
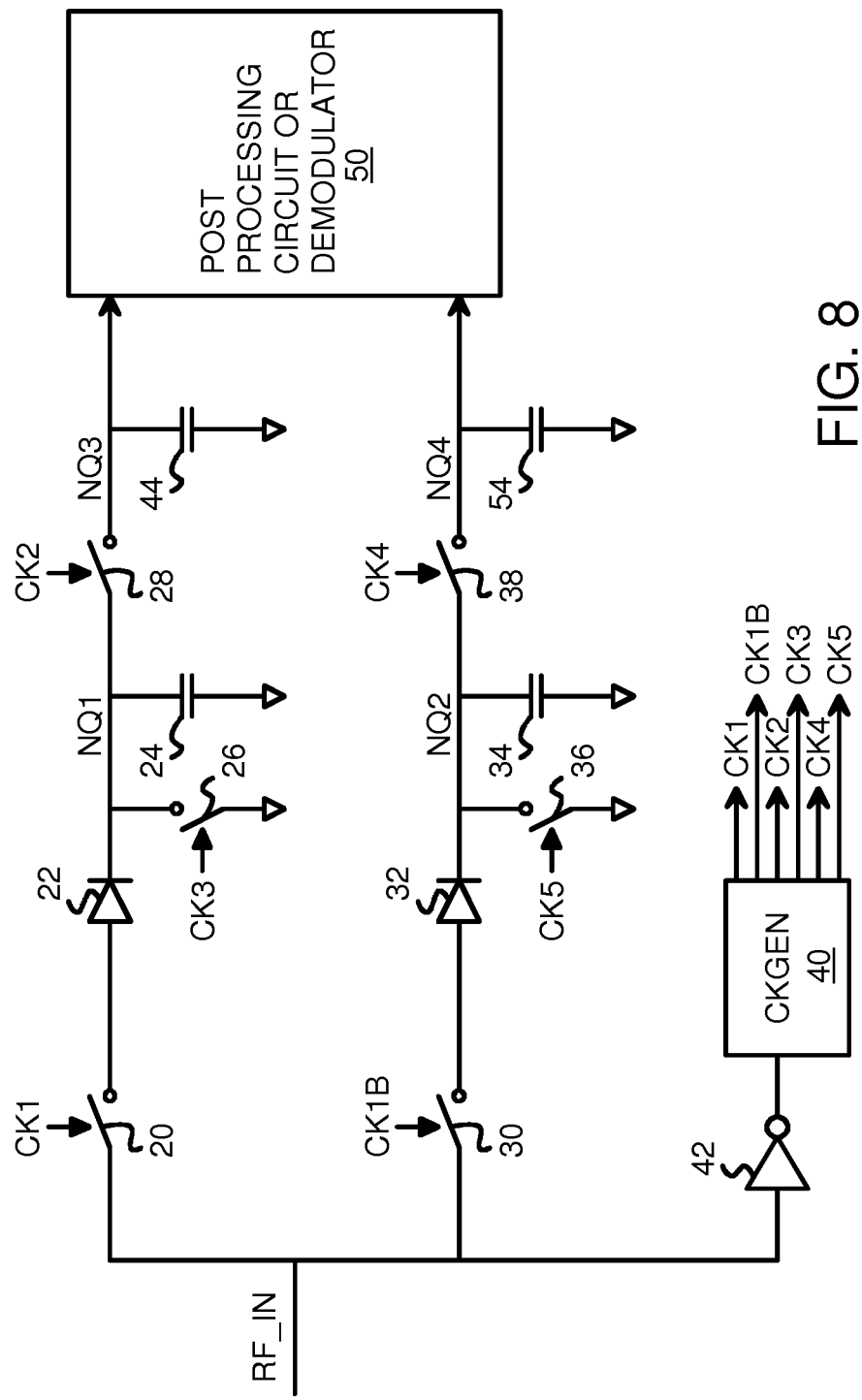
FIG. 8 shows an envelope detector with two independent paths that are combined by a post-processor.

FIG. 8 shows an envelope detector with two independent paths that are combined by a post-processor. In FIGS. 2-5, 7, the samples of the two channels are merged by summing output capacitor 94 as charge is shared when hold switches 28, 38 alternately open. In this embodiment, each channel has its own separate output capacitor 44, 54. Output capacitor 44 stores charge for the first channel on node NQ3, while second output capacitor 54 stores charge for the second channel on second output node NQ4.

The charge merging function that was performed by output capacitor 94 (FIGS. 2, 3, 5, 7) is replaced by post-processing circuit 50. Post-processing circuit 50 receives the two inputs from the two channels, NQ3 and NQ4, which represent the voltages sampled in two successive cycles of RF_IN. These output voltages may be converted to digital values by analog-to-digital converters (ADC's) and then combined digitally, such as by a digital-signal processor (DSP) or other binary logic. A demodulation routine may be executed by post-processing circuit 50. Alternately, post-processing circuit 50 may be an analog circuit that combines the two inputs NQ3, NQ4.

Figure 9:
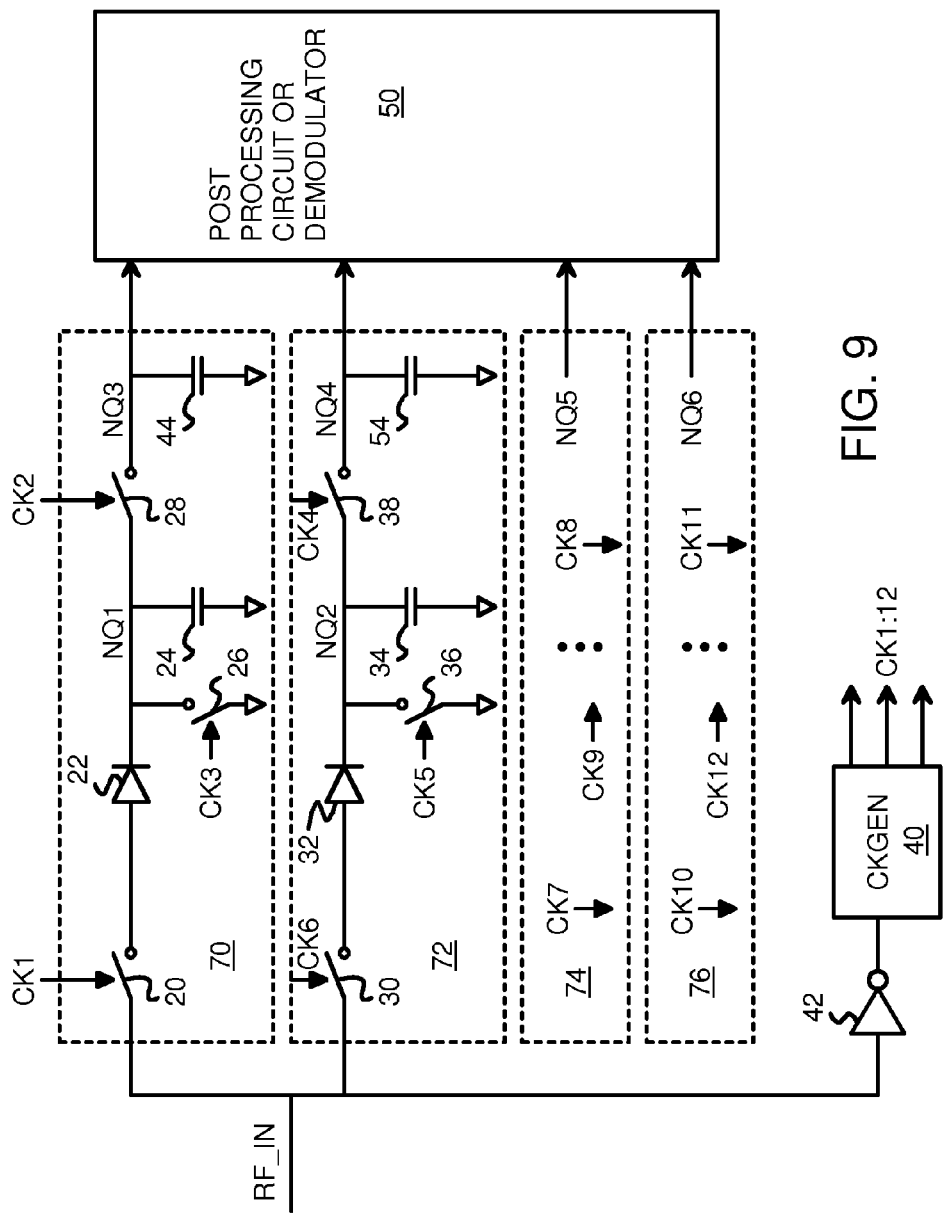
FIG. 9 shows an envelope detector with four independent paths that are combined by a post-processor.

FIG. 9 shows an envelope detector with four independent paths that are combined by a post-processor. Rather than two channels, four channels are provided, with each channel sampling input RF_IN once every four cycles.

First channel 70 samples RF_IN on the first of every four RF_IN cycles through sample switch 20 when CK1 is high to charge sampling capacitor 24 as described for FIGS. 2-8. Hold switch 28 shares charge to output capacitor 44 on output node NQ3 when CK2 is high. CK3 discharges sampling capacitor 24 using reset switch 26.

Second channel 72 samples RF_IN on the second of every four RF_IN cycles through sample switch 30 when CK6 is high to charge sampling capacitor 34 as described for FIGS. 2-8. Hold switch 38 shares charge to output capacitor 54 on output node NQ4 when CK4 is high. CK5 discharges sampling capacitor 34 using reset switch 36.

Third channel 74 samples RF_IN on the third of every four RF_IN cycles through a sample switch when CK7 is high to charge an internal sampling capacitor. A hold switch shares charge to an output capacitor on output node NQ5 when CK8 is high. CK9 discharges the internal sampling capacitor using a reset switch. Switches and capacitors within third channel 74 are the same as for first channel 70 but are not shown.

Fourth channel 76 samples RF_IN on the fourth of every four RF_IN cycles through a sample switch when CK10 is high to charge an internal sampling capacitor. A hold switch shares charge to an output capacitor on output node NQ6 when CK11 is high. CK12 discharges the internal sampling capacitor using a reset switch. Switches and capacitors within fourth channel 76 are the same as for first channel 70 but are not shown.

Figure 10:
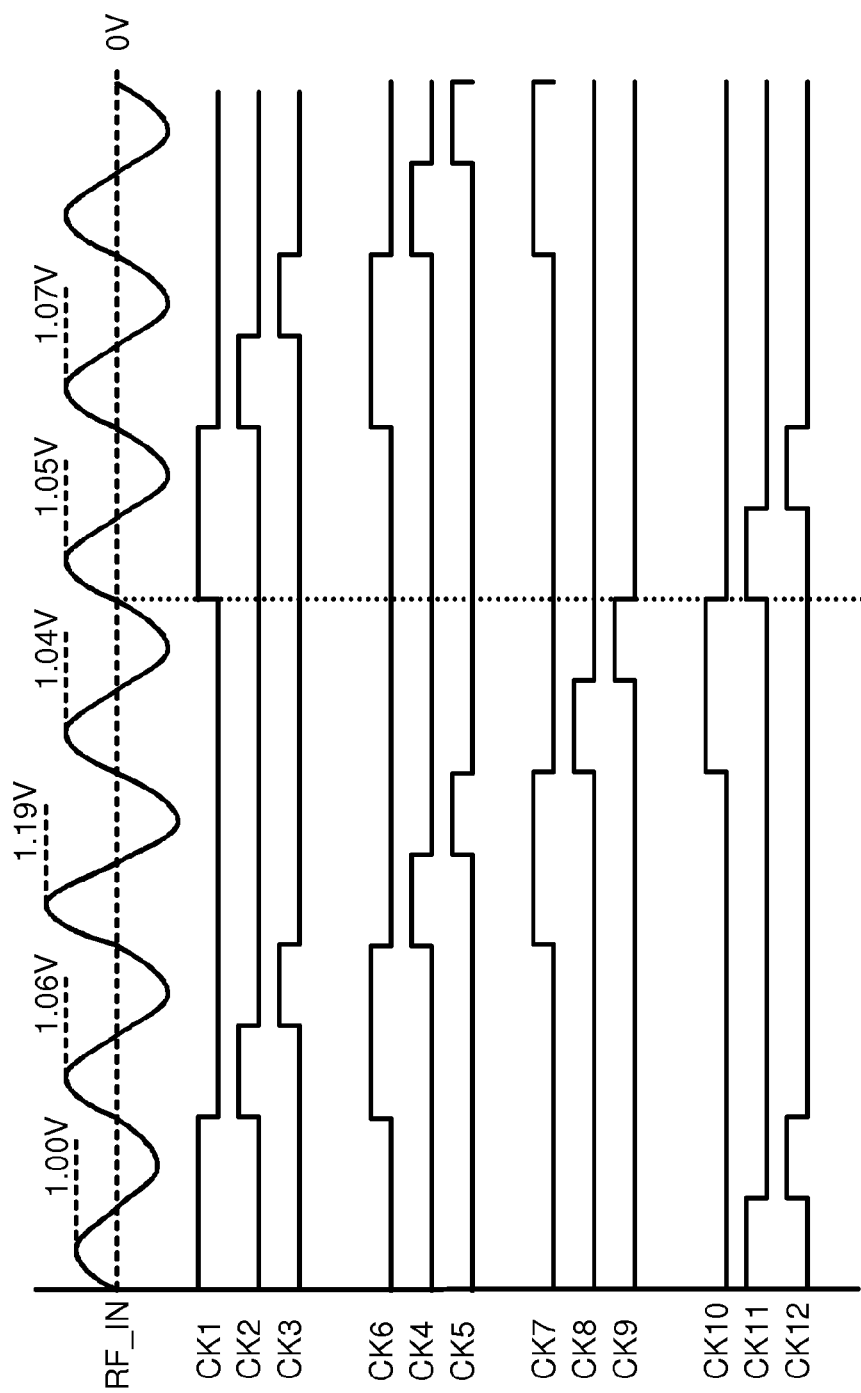
FIG. 10 is a timing diagram for the four-channel envelope detector of FIG. 9.
Figure 11:
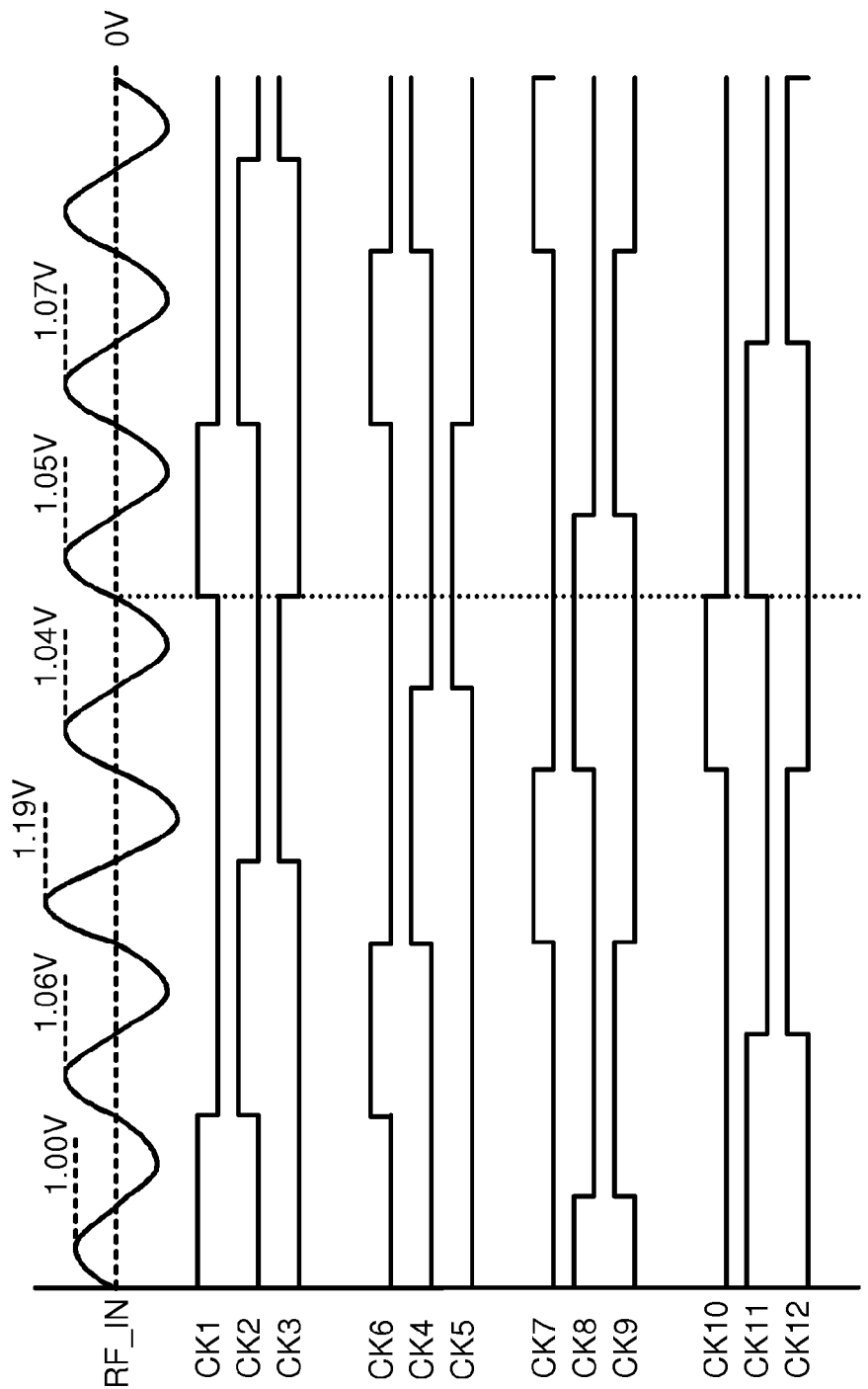
FIG. 11 is an alternate clock timing for the four-channel envelope detector of FIG. 9.

Clock generator 40 generates the clocks CK1-CK12 as shown in the timing diagrams FIG. 10 or 11. Post-processing circuit 50 receives four inputs NQ3, NQ4, NQ5, NQ6 and combines them to adjust the envelope signal for each cycle of input RF_IN. Thus the data rate may equal the carrier frequency.

Having four channels rather than two channels allows the switches, capacitors, and other circuitry within each channel to have twice as much time to operate. There is twice as much time available for charge sharing, charging, and discharging as for the two-channel embodiment, assuming identical conditions, process, and device sizes. The four channel embodiment may have a maximum theoretical data rate of double that of the two channel detector.

FIG. 10 is a timing diagram for the four-channel envelope detector of FIG. 9. The clocks are active-high, closing switches when high and causing switches to open and isolate when the clocks are low.

During the first of every four cycles of RF_IN, CK1 goes high to allow the first channel to sampled RF_IN. Then in the second cycle of RF_IN CK2 goes high to open the old switch and adjust the first-channel output NQ3 to post-processing circuit 50. Finally CK3 goes high to reset the first channel and discharge the internal sampling capacitor 24.

During the second of every four cycles of RF_IN, CK6 goes high to allow the second channel to sampled RF_IN. Then in the third cycle of RF_IN CK4 goes high to open the old switch and adjust the second-channel output NQ4 to post-processing circuit 50. Finally CK5 goes high to reset the second channel and discharge the internal sampling capacitor 34.

During the third of every four cycles of RF_IN, CK7 goes high to allow the third channel to sampled RF_IN. Then in the fourth cycle of RF_IN CK8 goes high to open the old switch and adjust the third-channel output NQ5 to post-processing circuit 50. Finally CK9 goes high to reset the third channel and discharge its internal sampling capacitor.

During the fourth of every four cycles of RF_IN, CK10 goes high to allow the fourth channel to sampled RF_IN. Then in the following first cycle (fifth) of RF_IN CK11 goes high to open the old switch and adjust the fourth-channel output NQ5 to post-processing circuit 50. Finally CK12 goes high to reset the fourth channel and discharge its internal sampling capacitor.

Post-processing circuit 50 receives the channel inputs NQ3-NQ6 with a delay of about one cycle of input RF_IN. Some additional delay by post-processing circuit 50 occurs before the final envelope detection signal is available to other circuits.

FIG. 11 is an alternate clock timing for the four-channel envelope detector of FIG. 9. In this variation of clock timing, the pulse widths of the hold and reset clocks are extended. This stretching of the narrower clocks provides more time for discharging the internal sampling capacitor and for charge sharing through the hold switches to the output capacitors.

The width of hold clocks CK2, CK4, CK8, and CK11 are increased from half a cycle to three half-cycles. Likewise, the width of reset clocks CK3, CK5, CK9, and CK12 are increased from half a cycle to three half-cycles, and are delayed until after the hold clocks have been de-asserted. Post-processing circuit 50 still receives the channel outputs NQ3-NQ6 at the same time theoretically, although when the circuit is running at a higher speed the charge-sharing delays may push the actual time when the output signals are stable into a latter cycle.

Figure 12A:
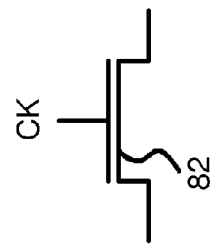
FIGS. 12A-C show that switches may be implemented as n-channel transistors, p-channel transistors, or transmission gates with parallel n-channel and p-channel transistors.
Figure 12B:
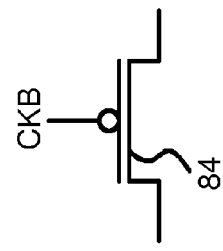
Figure 12C:
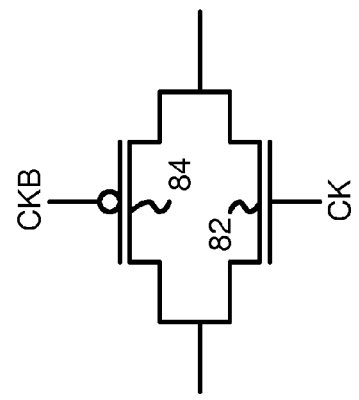

FIGS. 12A-C show that switches may be implemented as n-channel transistors, p-channel transistors, or transmission gates with parallel n-channel and p-channel transistors. FIG. 12A shows n-channel transistor 82 with a gate receiving the clock signal CK, such as CK1 for switch 20 in FIG. 2. When CK is high, n-channel transistor 82 closes the drain to source connection, allowing current flow and connecting together the two terminals. When CK is low, n-channel transistor 82 opens the drain to source connection, blocking current flow and isolating the two terminals.

FIG. 12B shows p-channel transistor 84 with a gate receiving the clock signal CKB, such as the inverse of CK1 for switch 20 in FIG. 2. When CK is high, CKB is low, p-channel transistor 84 closes the drain to source connection, allowing current flow and connecting together the two terminals. When CK is low, CKB is high, p-channel transistor 84 opens the drain to source connection, blocking current flow and isolating the two terminals.

FIG. 12C shows a transmission gate with n-channel transistor 82 with a gate receiving CK, and p-channel transistor 84 with a gate receiving the inverse clock signal CKB, such as the inverse of CK1 for switch 20 in FIG. 2. The source of n-channel transistor 82 is connected to the drain of p-channel transistor 84, and the drain of n-channel transistor 82 is connected to the source of p-channel transistor 84. The terms source and drain are interchangeable since they depend on the voltage biases applied.

When CK is high, n-channel transistor 82 closes the drain to source connection, allowing current flow and connecting together the two terminals. Also, CKB is low, so p-channel transistor 84 closes the drain to source connection, allowing current flow and connecting together the two terminals.

When CK is low, n-channel transistor 82 opens the drain to source connection, blocking current flow and isolating the two terminals. Also, CKB is high, so p-channel transistor 84 opens the drain to source connection, blocking current flow and isolating the two terminals.

The bulk or substrate terminal of n-channel transistor 82 can be connected to the lowest available voltage, such as ground when the midpoint is VDD/2, or to an average of the negative peak voltages, or to a substrate bias voltage VBB. Similarly, the bulk or substrate terminal of p-channel transistor 84 can be connected to the highest available voltage, such as VDD.

ALTERNATE EMBODIMENTS

Several other embodiments are contemplated by the inventors. For example various combinations of the embodiments shown are contemplated. Any embodiment may use a clock recovered from input RF_IN or from an independent clock source as shown in FIG. 7. While one, two, or four channels have been described, a different number of channels may be included, such as 8 or 16 channels, or a non-binary number of channels such as 3, 5, 6, etc. A single output capacitor 44 could merge charge from three or four channels rather than use post-processing circuit 50. Post-processing circuit 50 could accept one or more channels with forward diodes for positive envelope detection, and other channels with reversed diodes for negative envelope detection. Thus post-processing circuit 50 could generate both the upper and lower envelope signals. While a single post-processing circuit 50 has been shown, two or more post-processing circuits 50 could be used, or a single post-processing circuit 50 could have multiple paths.

Output capacitor 44 followed by buffers or demodulator stages or post-processing circuit 50 may generate a full-swing, rail-to-rail output signal. Clock-recovery inverter 42 may be a limiting amplifier or a chain of inverters to perform clock recovery or demodulation. Clock generator 40 may be a combination of latches, flip-flops, logic gates, inverters, delay cells, buffers, and transmission gates. The independent clock source CK_SRC may be generated from the input signal RF_IN or a pre-cursor, and thus the clock source CK_SRC may not be truly independent but be a derived clock source. The clock source CK_SRC could have a different frequency than RF_IN, such as by being a multiple or a divided version of the transmitted carrier wave. Clocks may be non-overlapping, or may be tweaked, skewed, or have edges delayed to prevent race or feed-through conditions.

Although single-ended signals have been described, fully differential signals could also be used with the envelope detector. Fully differential switches could be used, or two paths, for positive and negative differential lines, could be dedicated to each differential signal. Rather than grounding components, the grounded terminals could be connected to the other of the differential paths.

While a Radio-Frequency (RF) input RF_IN has been described, the frequency of the input does not have to be in the RF range, but could be other frequencies, such as audio or microwave. While Amplitude-Modulation (AM) and Amplitude-Shift-Keying (ASK) coded inputs have been described, other kinds of amplitude modulation coding schemes could be used, such as Pulse-Amplitude-Modulation (PAM). While the RF_IN input being generated by a transmitter and received by a receiver has been described as a general environment, the transmitter and receiver could be on the same board, substrate, or chip. While a carrier wave that is a sine wave has been described, the carrier wave could have other shapes, such as a rectangular wave, a triangle wave, saw tooth wave, etc. or various distortions, especially at higher speeds.

The envelope detection circuit may be used for other applications and systems, such as for Global-Positioning Systems (GPS), Near-Field-Communications (NFC), Radio-Frequency Identification (RFID) readers, cable modems, Radio-Frequency (RF) base stations, transmitters, and receivers.

In an actual system the peak voltages may be larger or smaller than shown in FIG. 4 and FIGS. 10-11, such as only a few hundred millivolts or less. Also, the changes in peak voltage may occur more slowly over more cycles. While an alternating input signal RF_IN has been describes that swings from a mid-point or common-mode voltage of ground to positive and negative peaks, the mid-point voltage could be shifted to some other value, such as half the power-supply voltage, or VDD/2. In this alternative, reset switches 26, 36, sampling capacitors 24, 34, and output capacitor 44 connect to VDD/2 rather than to ground.

While diode 22 has been shown after sample switch 20, diode 22 could be located before sample switch 20. Then a single diode could be substituted for the two diodes 22, 32. The merged or combined diode is placed between RF_IN and a rectifier node. The rectifier node connects to the left inputs of switch 20 and of switch 30. Thus a single combined diode is used for both channels. Likewise, other diodes could be placed before or after sample switches while still being in series with the sample switches.

Although in the ideal case there is little or no voltage drop between the ideal envelope signal and the actual envelop signal, such as shown in FIG. 1, at higher data rates the voltage drop increases. For example, at a 100 MHz data rate and carrier frequency, the amplitude may be reduced by half. The amplitude reduction may put a limit on the data rate allowed. However, some prior art envelope detectors may have 50% amplitude reductions at only 1 MHz.

While diodes have been described in each channel, these diodes could be p-n junctions or could be diode-connected transistors. A bridge rectifier or an external rectifier could also be used. An n-channel transistor with its gate and drain connected together and to sample switch 20 with a source connected to node NQ1 can act as a diode for positive envelope detection. Capacitors may be transistors with sources and drains connected together as one capacitor terminal, and the gate as the second capacitor terminal. Other kinds of capacitors could be used, such as a Metal-Insulator-Metal (MIM) capacitor or a Metal-Oxide-Metal (MoM) capacitor or Metal-Metal or Poly-Poly or Metal-Poly or other off-chip capacitors such as a ceramic capacitor or a thin-film capacitor or a polyester capacitor.

Some embodiments may not use all components. For example, switches may be added or deleted in some embodiments. Different kinds of switches may be used, such as 2-way switches or 3-way switches. Muxes may be used as switches. Input or output resistors could be added, or input or output filters used. Inversions may be added.

Capacitors, resistors, and other filter elements may be added. Switches could be n-channel transistors, p-channel transistors, or transmission gates with parallel n-channel and p-channel transistors, or more complex circuits, either passive or active, amplifying or non-amplifying. External switches such as relays could also be used.

Additional components may be added at various nodes, such as resistors, capacitors, inductors, transistors, extra buffering, etc., and parasitic components may also be present. Enabling and disabling the circuit could be accomplished with additional transistors or in other ways. Pass-gate transistors or transmission gates could be added for isolation.

The final sizes of transistors, capacitors, and other components may be selected after circuit simulation or field testing. Metal-mask options or other programmable components may be used to select the final transistor sizes. Transistors may be connected together in parallel to create larger transistors that have the same fringing or perimeter effects across several sizes. Currents may be positive currents or negative currents that flow in an opposite direction. Charging of a capacitor may be charging with positive charge or charging with negative charge. Thus the terms charging and discharging can be with respect to current in either direction, or with either positive or negative charges. Peaks in the input signal may be positive peaks or negative peaks (troughs).

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:
1. An envelope detector comprising:
an input having a carrier wave that is Amplitude-Modulated (AM) or Amplitude-Shift-Keying (ASK) coded;
a clock generator that generates a first sampling clock, a first hold clock, and a first reset clock in a first sequence wherein the first sampling clock is active before the first hold clock is active, and the first hold clock is active before the first reset clock is active, wherein the first sequence has a duration of two or more cycles of the carrier wave of the input, and wherein the first sequence is repeated every two or more cycles of the carrier wave;
a first sample switch clocked by the first sampling clock to conduct during a first cycle of the carrier wave;
a first rectifier connected to the first sample switch to permit current flow in a first direction and to block current flow in a second direction that is opposite from the first direction;
wherein the first sample switch and the first rectifier are connected in series between the input and a first internal node;

a first sampling capacitor on the first internal node for storing a first sampled charge that is a function of a peak voltage of the input during the first cycle;

a first reset switch on the first internal node for removing the first sampled charge on the first sampling capacitor in response to the first reset clock; and a first hold switch, coupled between the first internal node and a first output node, and clocked by the first hold clock to conduct after the first cycle is completed;

wherein the first output node has a first modulated signal that is a function of peaks of the input during the first cycles.

2. The envelope detector of claim 1 wherein the clock generator further generates a second sampling clock, a second hold clock, and a second reset clock in a second sequence wherein the second sampling clock is active before the second hold clock is active, and the second hold clock is active before the second reset clock is active, wherein the second sequence has a duration of two or more cycles of the carrier wave of the input, and wherein the second sequence is repeated every two or more cycles of the carrier wave and is offset from the first sequence by one cycle of the carrier wave;

further comprising:

a second sample switch clocked by the second sampling clock to conduct during a second cycle of the carrier wave;

a second rectifier connected to the second sample switch to permit current flow in a first direction and to block current flow in a second direction that is opposite from the first direction;

wherein the second sample switch and the second rectifier are connected in series between the input and a second internal node;

a second sampling capacitor on the second internal node for storing a second sampled charge that is a function of a peak voltage of the input during the second cycle;

a second reset switch on the second internal node for removing the second sampled charge on the second sampling capacitor in response to the second reset clock; and a second hold switch, coupled between the second internal node and a second output node, and clocked by the second hold clock to conduct after the second cycle is completed;

wherein the second output node has a second modulated signal that is a function of peaks of the input during the second cycles.

3. The envelope detector of claim 2 further comprising:
an output combiner that combines sample and hold signals from the first output node and from the second output node.

4. The envelope detector of claim 3 wherein the output combiner comprises a summing capacitor on an output node, wherein the output node is hardwired to the first output node and to the second output node;

wherein an output voltage on the summing capacitor is adjusted for each cycle of the carrier wave, alternately by the first sampled charge and by the second sampled charge, to track peak voltages of the input as a detected envelope signal.

5. The envelope detector of claim 3 wherein the output combiner comprises a post-processing circuit that receives the first output node and receives the second output node and generates a detected envelope signal that is a function of peak voltages of the input by combining signals from the first output node and the second output node.

6. The envelope detector of claim 5 wherein the output combiner comprises a digital-signal processor (DSP).

7. The envelope detector of claim 5 wherein the output combiner comprises a demodulator.

8. The envelope detector of claim 5 further comprising:
a first output capacitor on the first output node; and
a second output capacitor on the second output node.

9. The envelope detector of claim 2 wherein the clock generator generates the first sampling clock to be active during a first cycle of the input, the first hold clock to be active during a first portion of a second cycle of the input, and the first reset clock to be active during a second portion of the second cycle of the input;

wherein the clock generator generates the second sampling clock to be active during a second cycle of the input, the second hold clock to be active during a first portion of the first cycle of the input, and the second reset clock to be active during a second portion of the first cycle of the input.

10. The envelope detector of claim 2 further comprising:
a clock-recovery circuit coupled to the input, for recovering a recovered clock from the input, wherein the recovered clock is input to the clock generator.

11. The envelope detector of claim 2 further comprising:
a source clock that is not generated from the input, the source clock being input to the clock generator,
wherein the source clock is not phase-locked to the input.

12. The envelope detector of claim 3 wherein the first direction is a reverse direction, wherein the first rectifier blocks positive current flow from the input and allows reverse current flow to the input from the first sampling capacitor;

wherein the first output node has the first modulated signal that is a function of negative peaks of the input during the first cycles.

13. The envelope detector of claim 3 wherein the first rectifier is a diode or a diode-connected transistor.

14. The envelope detector of claim 3 wherein the first sample switch, the first hold switch, the first reset switch, the second sample switch, the second hold switch, and the second reset switch each comprise a n-channel transistor having a gate receive a clock, or a p-channel transistor having a gate receiving an inverse of a clock, or a transmission gate having both the p-channel transistor and the n-channel transistor in parallel.

15. The envelope detector of claim 3 wherein the clock generator further generates a third sampling clock, a third hold clock, and a third reset clock in a third sequence wherein the third sampling clock is active before the third hold clock is active, and the third hold clock is active before the third reset clock is active, wherein the third sequence has a duration of two or more cycles of the carrier wave of the input, and wherein the third sequence is repeated every four or more cycles of the carrier wave and is offset from the first sequence by two cycles of the carrier wave;

further comprising:

a third sample switch clocked by the third sampling clock to conduct during a third cycle of the carrier wave;

a third rectifier connected to the third sample switch to permit current flow in a first direction and to block current flow in a third direction that is opposite from the first direction;

wherein the third sample switch and the third rectifier are connected in series between the input and a third internal node;

a third sampling capacitor on the third internal node for storing a third sampled charge that is a function of a peak voltage of the input during the third cycle;

a third reset switch on the third internal node for removing the third sampled charge on the third sampling capacitor in response to the third reset clock;
a third hold switch, coupled between the third internal node and a third output node, and clocked by the third hold clock to conduct after the third cycle is completed;
wherein the third output node has a third modulated signal that is a function of peaks of the input during the third cycles;
wherein the clock generator further generates a fourth sampling clock, a fourth hold clock, and a fourth reset clock in a fourth sequence wherein the fourth sampling clock is active before the fourth hold clock is active, and the fourth hold clock is active before the fourth reset clock is active, wherein the fourth sequence has a duration of two or more cycles of the carrier wave of the input, and wherein the fourth sequence is repeated every four or more cycles of the carrier wave and is offset from the first sequence by three cycles of the carrier wave;
a fourth sample switch clocked by the fourth sampling clock to conduct during a fourth cycle of the carrier wave;
a fourth rectifier connected to the fourth sample switch to permit current flow in a first direction and to block current flow in a fourth direction that is opposite from the first direction;
wherein the fourth sample switch and the fourth rectifier are connected in series between the input and a fourth internal node;
a fourth sampling capacitor on the fourth internal node for storing a fourth sampled charge that is a function of a peak voltage of the input during the fourth cycle;
a fourth reset switch on the fourth internal node for removing the fourth sampled charge on the fourth sampling capacitor in response to the fourth reset clock; and
a fourth hold switch, coupled between the fourth internal node and a fourth output node, and clocked by the fourth hold clock to conduct after the fourth cycle is completed;
wherein the fourth output node has a fourth modulated signal that is a function of peaks of the input during the fourth cycles;
wherein the output combiner combines sample and hold signals from the first output node, and from the second output node, and from the third output node, and from the fourth output node.

16. An amplitude envelope detector comprising:
an input receiving an amplitude-modulated or an Amplitude-Shift-Keying (ASK) encoded input signal wherein a carrier wave has modulated peak voltages;
first sample switch means for conducting current in response to a first sampling clock;
first rectifier means for permitting current flow in a forward direction and for blocking current flow in a reverse direction that is opposite to the forward direction;
wherein the first sample switch means and the first rectifier means are in series between the input and a first channel node;
first sampling capacitor means for storing charge on the first channel node;
first reset switch means for discharging the first sampling capacitor means in response to a first reset clock;
first hold switch means for conducting a first charge from the first channel node to a first output node in response to a first hold clock;
second sample switch means for conducting current in response to a second sampling clock;
second rectifier means for permitting current flow in a forward direction and for blocking current flow in a reverse direction that is opposite to the forward direction;
wherein the second sample switch means and the second rectifier means are in series between the input and a second channel node;
second sampling capacitor means for storing charge on the second channel node;
second reset switch means for discharging the second sampling capacitor means in response to a second reset clock;
second hold switch means for conducting a second charge from the second channel node in response to a second hold clock;
combination means for combining the first charge and the second charge to generate an envelope signal, wherein the envelope signal varies with the modulated peak voltages of the input.

17. The amplitude envelope detector of claim 16 wherein the second hold switch means conducts the second charge to the first output node in response to a second hold clock;
summing capacitor means, connected to the first output node, for storing the first charge and for storing the second charge on the first output node to generate the envelope signal.

18. The amplitude envelope detector of claim 17 further comprising:
demodulation means, coupled to the envelope signal, for demodulating the envelope signal.

19. The amplitude envelope detector of claim 16 further comprising:
first output capacitor means for storing the first charge on the first output node;
second output capacitor means for storing the second charge on a second output node; and
post-processing means for combining a first output signal on the first output node with a second output signal on the second output node to generate the envelope signal.

20. The amplitude envelope detector of claim 16 further comprising:
clock generation means for generating the first sampling clock during a first cycle of the input, and for generating the second sampling clock during a second cycle of the input, and for generating the first hold clock after the first sampling clock is de-asserted, and for generating the first reset clock after the first hold clock is de-asserted, and for and for generating the second hold clock after the second sampling clock is de-asserted, and for generating the second reset clock after the second hold clock is de-asserted.

21. The amplitude envelope detector of claim 20 further comprising:
clock recovery means for generating a recovered clock from the input, the clock recovery means detecting the carrier wave from the input;
wherein the recovered clock is input to the clock generation means.

22. The amplitude envelope detector of claim 20 further comprising:
clock source means for receiving a source clock;
wherein the source clock is input to the clock generation means.

23. A multi-channel envelope detect circuit comprising:
a modulated input receiving an amplitude-modulated or an Amplitude-Shift-Keying (ASK) encoded input signal wherein a carrier wave has modulated peak voltages;

a first sample switch clocked by a first sampling clock to conduct to a first internal node during a first cycle of the carrier wave;
a combined rectifier connected between the modulated input and the first sample switch to permit current flow in a forward direction to a rectifier node and to block current flow in a reverse direction;
a first sampling capacitor on the first internal node for storing a first sampled charge that is a function of a modulated peak voltage of the modulated input during the first cycle;
a first reset switch on the first internal node for discharging the first sampled charge on the first sampling capacitor in response to a first reset clock;
a first hold switch, coupled between the first internal node and a summing node, and clocked by a first hold clock to conduct after the first cycle is completed;
a second sample switch clocked by a second sampling clock to conduct from the rectifier node to a second internal node during a second cycle of the carrier wave;
a second sampling capacitor on the second internal node for storing a second sampled charge that is a function of a the modulated peak voltages of the modulated input during the second cycle;
a second reset switch on the second internal node for discharging the second sampled charge on the second sampling capacitor in response to a second reset clock;
a second hold switch, coupled between the second internal node and the summing node, and clocked by a second hold clock to conduct after the second cycle is completed; and
a summing capacitor on the summing node, the summing capacitor generating an output voltage that tracks the modulated peak voltages of the modulated input.

\* \* \* \* \*